United States Patent
Cheng et al.

(10) Patent No.: US 11,253,803 B2
(45) Date of Patent: Feb. 22, 2022

(54) DUST COLLECTOR AND ELECTRONIC SYSTEM CAPABLE OF AUTOMATICALLY REMOVING DUST

(71) Applicant: Wiwynn Corporation, New Taipei (TW)

(72) Inventors: Wei Yang Cheng, New Taipei (TW); Cheng-Sen Kao, New Taipei (TW)

(73) Assignee: Wiwynn Corporation, New Taipei (TW)

(*) Notice: Subject to any disclaimer, the term of this patent is extended or adjusted under 35 U.S.C. 154(b) by 577 days.

(21) Appl. No.: 15/988,846

(22) Filed: May 24, 2018

(65) Prior Publication Data
US 2019/0275452 A1 Sep. 12, 2019

(30) Foreign Application Priority Data
Mar. 9, 2018 (TW) .................. 107107967

(51) Int. Cl.
| | |
|---|---|
| *B01D 45/12* | (2006.01) |
| *B01D 45/06* | (2006.01) |
| *B01D 45/16* | (2006.01) |
| B01D 45/04 | (2006.01) |
| B01D 45/08 | (2006.01) |
| H05K 7/20 | (2006.01) |

(52) U.S. Cl.
CPC .............. *B01D 45/06* (2013.01); *B01D 45/12* (2013.01); *B01D 45/16* (2013.01); *B01D 45/04* (2013.01); *B01D 45/08* (2013.01); *H05K 7/20181* (2013.01)

(58) Field of Classification Search
CPC ........ B01D 45/06; B01D 45/16; B01D 45/12; B01D 45/04; B01D 45/08; H05K 7/20181
See application file for complete search history.

(56) References Cited

U.S. PATENT DOCUMENTS

| | | | | |
|---|---|---|---|---|
| 5,487,768 | A * | 1/1996 | Zytka | B01D 46/0023 454/187 |
| 2002/0062632 | A1* | 5/2002 | Oh | A47L 9/1608 55/337 |
| 2003/0075046 | A1* | 4/2003 | Lenzing | B01D 45/06 95/267 |

(Continued)

FOREIGN PATENT DOCUMENTS

| | | |
|---|---|---|
| CN | 206039393 U | 3/2017 |
| CN | 206304453 U | 7/2017 |

(Continued)

OTHER PUBLICATIONS

Office Action dated Dec. 10, 2018 in corresponding Taiwan Patent Application No. 107107967.

(Continued)

*Primary Examiner* — Dung H Bui
(74) *Attorney, Agent, or Firm* — Donald E. Stout; Stout, Uxa & Buyan, LLP

(57) ABSTRACT

A dust collector includes a housing, a passage structure and a dust collecting region. The passage structure is disposed in the housing, and configured to accelerate an airflow containing dust particles and separate the dust particles from the airflow. The dust collecting region is connected to the passage structure, and is configured to collect at least part of the dust particles of the airflow.

18 Claims, 16 Drawing Sheets

(56) References Cited

U.S. PATENT DOCUMENTS

| | | | | |
|---|---|---|---|---|
| 2005/0274094 A1* | 12/2005 | DeMarco | ............... | B01D 45/08 55/356 |
| 2006/0080947 A1* | 4/2006 | Lee | ................ | B01D 45/12 55/426 |
| 2007/0079579 A1* | 4/2007 | Eddington | ............... | B04C 5/13 55/337 |
| 2007/0272625 A1* | 11/2007 | Moskun | ............... | C02F 1/004 210/767 |
| 2010/0224069 A1* | 9/2010 | Donadei | ......... | B60K 15/03504 96/141 |
| 2011/0179755 A1* | 7/2011 | Gruhler | ............... | B29C 65/58 55/320 |
| 2012/0031272 A1* | 2/2012 | Rubit | ............... | B01D 45/06 95/287 |
| 2014/0020558 A1* | 1/2014 | Gururaja Rao | ......... | B03C 3/011 95/69 |
| 2014/0208701 A1* | 7/2014 | Neu | ............... | B01D 45/12 55/318 |
| 2014/0224123 A1* | 8/2014 | Walters | ............... | B01D 50/002 95/272 |
| 2014/0250625 A1* | 9/2014 | Huang | ............... | B01D 45/16 15/353 |
| 2016/0367932 A1* | 12/2016 | Novosel | ............ | B01D 46/0027 |
| 2017/0354908 A1* | 12/2017 | Prasad | ............... | B01D 45/12 |
| 2017/0370287 A1* | 12/2017 | Pearson | ............... | F01D 17/145 |
| 2018/0058323 A1* | 3/2018 | Smith, III | ............... | F02K 3/04 |
| 2018/0079973 A1* | 3/2018 | Chen | ............... | B01J 8/0065 |
| 2019/0078472 A1* | 3/2019 | Tan | ............... | F01D 5/187 |
| 2019/0111375 A1* | 4/2019 | Chen | ............... | B01D 46/30 |
| 2019/0168146 A1* | 6/2019 | Garrett | ............... | B01D 46/003 |

FOREIGN PATENT DOCUMENTS

| | | | | |
|---|---|---|---|---|
| CN | 107115723 A | * | 9/2017 | ............ B01D 45/06 |
| CN | 107402606 A | | 11/2017 | |
| TW | 338946 U | | 8/1998 | |
| TW | 201226718 A | | 7/2012 | |

OTHER PUBLICATIONS

Office Action dated Jan. 29, 2021 in corresponding Chinese Patent Application No. 201810300352.7.

* cited by examiner

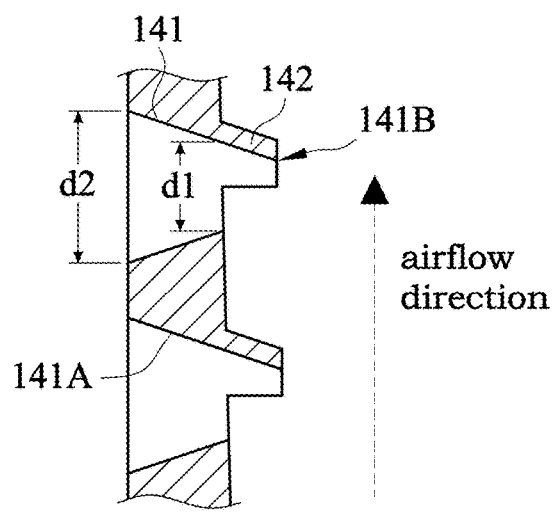 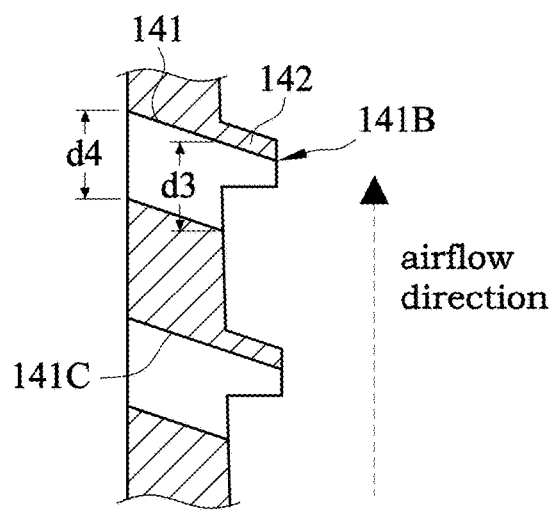
FIG. 2A      FIG. 2B
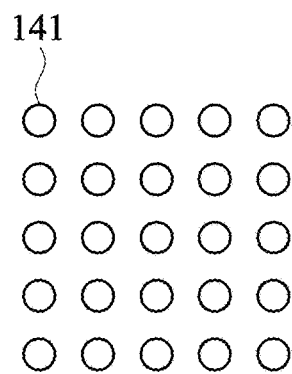 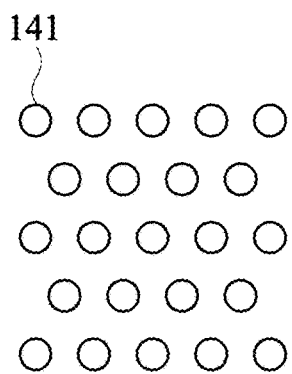 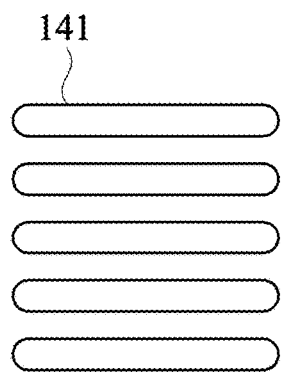
FIG. 3A      FIG. 3B      FIG. 3C

DUST COLLECTOR AND ELECTRONIC SYSTEM CAPABLE OF AUTOMATICALLY REMOVING DUST

CROSS-REFERENCE TO RELATED APPLICATIONS

This application claims priority of Taiwan Patent Application No. 107107967, filed on Mar. 9, 2018, the entire contents of which are hereby incorporated by reference.

BACKGROUND OF THE INVENTION

1. Field of the Invention

The present disclosure generally relates to a dust collector, and more particularly to an electronic system capable of automatically dissipating heat and removing dust.

2. Description of Related Art

There are two main sources of dust particles: natural and man-made. The former may be dust particles generated, for example, by a forest fire, and the latter may be dust particles generated, for example, by grinding or burning in an industry process. The dust particles may not only harm human health, but also damage equipment. Therefore, equipment is commonly disposed in a housing, which prevents dust particles and protects the equipment.

An ordinary electronic device, such as a computer or server, generates heat when in operation. As the electronic device needs a heat dissipation passage to dissipate the generated heat, the housing thus cannot be closed. Accordingly, dust particles may probably enter the electronic device. The dust particles, if not timely collected and removed, may be fallen on electronic elements of the electronic device, and obstruct heat dissipation of the electronic elements, thus decreasing efficiency or even having breakdown of the electronic device.

A need has thus arisen to propose a novel dust collector capable of removing dust particles and maintaining heat dissipation efficiency.

SUMMARY OF THE INVENTION

In view of the foregoing, it is an object of the embodiment of the present disclosure to provide a dust collector, the airflow path of which may operate in coordination with a heat dissipation path of an electronic device, therefore effectively removing dust particles without obstructing heat dissipation of the electronic device.

According to one embodiment, a dust collector includes a housing, a passage structure and a dust collecting region. The passage structure is disposed in the housing to accelerate an airflow containing dust particles and to separate the dust particles from the airflow. The dust collecting region is connected to the passage structure to collect at least part of the dust particles of the airflow. In one embodiment, the passage structure includes a base and a guide block. The base is disposed at a bottom of the housing. The guide block is disposed at a top of the housing, the guide block including a front guide surface and a rear guide surface disposed on a front side and a rear side of the guide block respectively.

According to another embodiment, an electronic system capable of automatically removing dust includes an electronic device and at least one dust collector. The electronic device generates a heat collecting airflow in a heat dissipation path of the electronic device. The dust collector is connected to one side of the electronic device, and an airflow inlet of the dust collector allows the heat collecting airflow to enter.

BRIEF DESCRIPTION OF THE DRAWINGS

FIG. 2A and FIG. 2B show cross-sectional views illustrating the shield of FIG. 1A;

FIG. 3A to FIG. 3C show schematic diagrams illustrating arrangements of the through holes of the shield;

DETAILED DESCRIPTION OF THE INVENTION

Figure 1A:
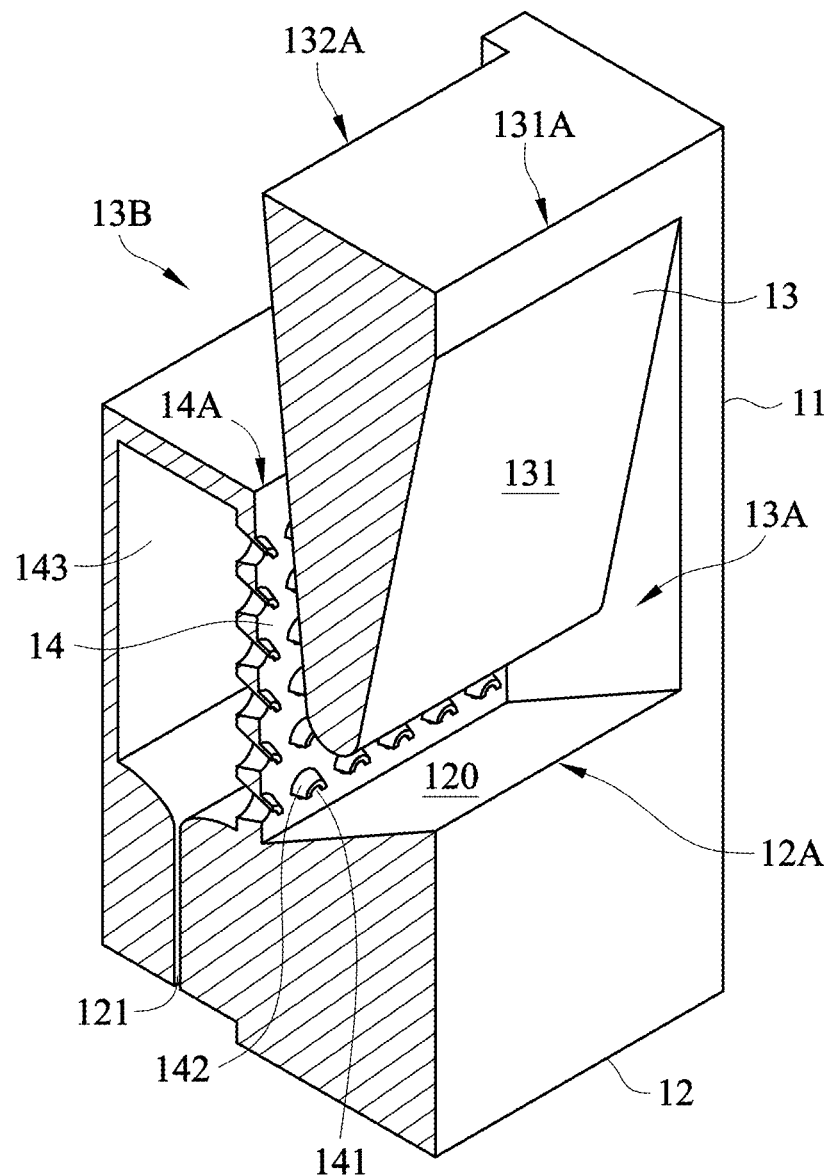
FIG. 1A shows a perspective view illustrating a dust collector according to a first embodiment of the present disclosure.
Figure 1B:
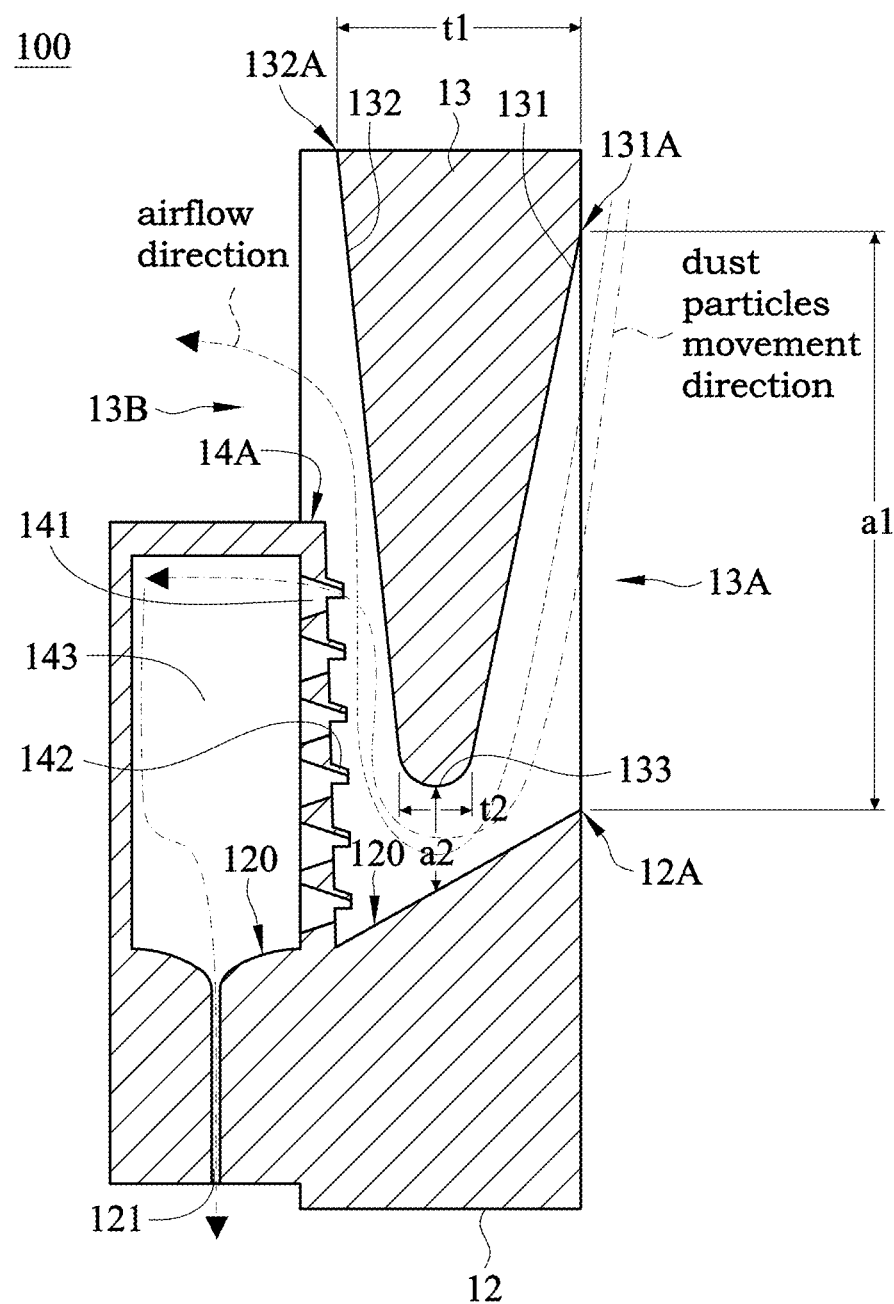
FIG. 1B shows a cross-sectional view of the dust collector of FIG. 1A.

FIG. 1A shows a perspective view illustrating a dust collector 100 according to a first embodiment of the present disclosure, and FIG. 1B shows a cross-sectional view of the dust collector 100 of FIG. 1A. In the embodiment, the dust collector 100 may include a housing 11 configured to support and/or protect internal parts of the dust collector 100. The dust collector 100 may include a base 12 disposed at a bottom of the housing 11. According to one aspect of the embodiment, the dust collector 100 may include a guide block 13 disposed at a top of the housing 11, and configured to guide an airflow containing dust particles. In one example, the airflow may be generated, for example, by a fan (not shown). In the embodiment, the base 12 and the guide block 13 together construct a passage structure as will be described in details later in the specification.

Figure 1C:
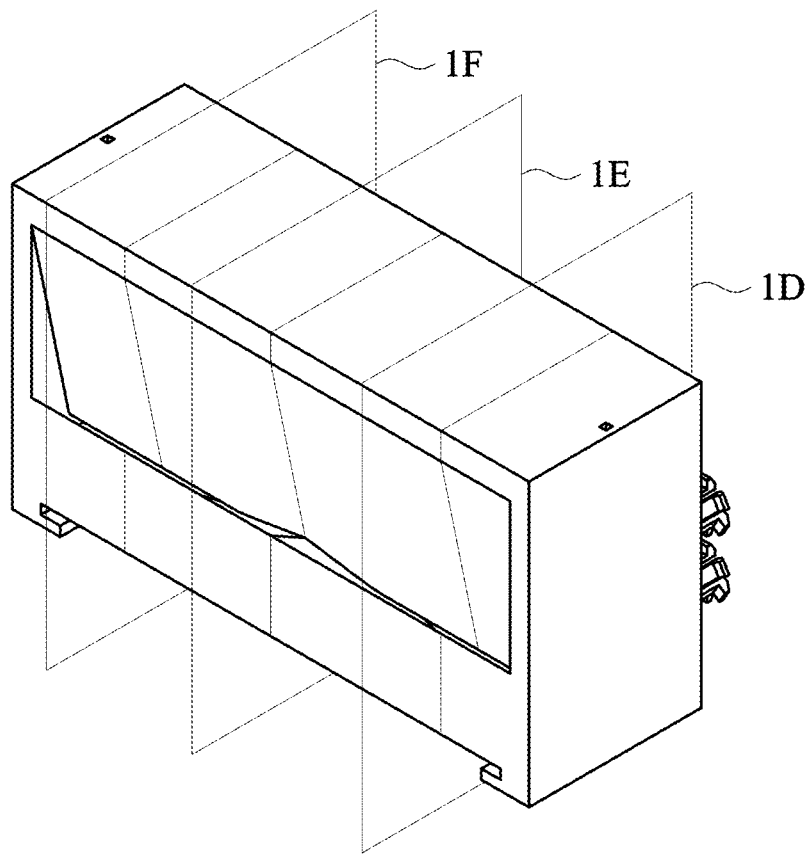
FIG. 1C shows a perspective view illustrating a dust collector according to one embodiment of the present disclosure.
Figure 1D:
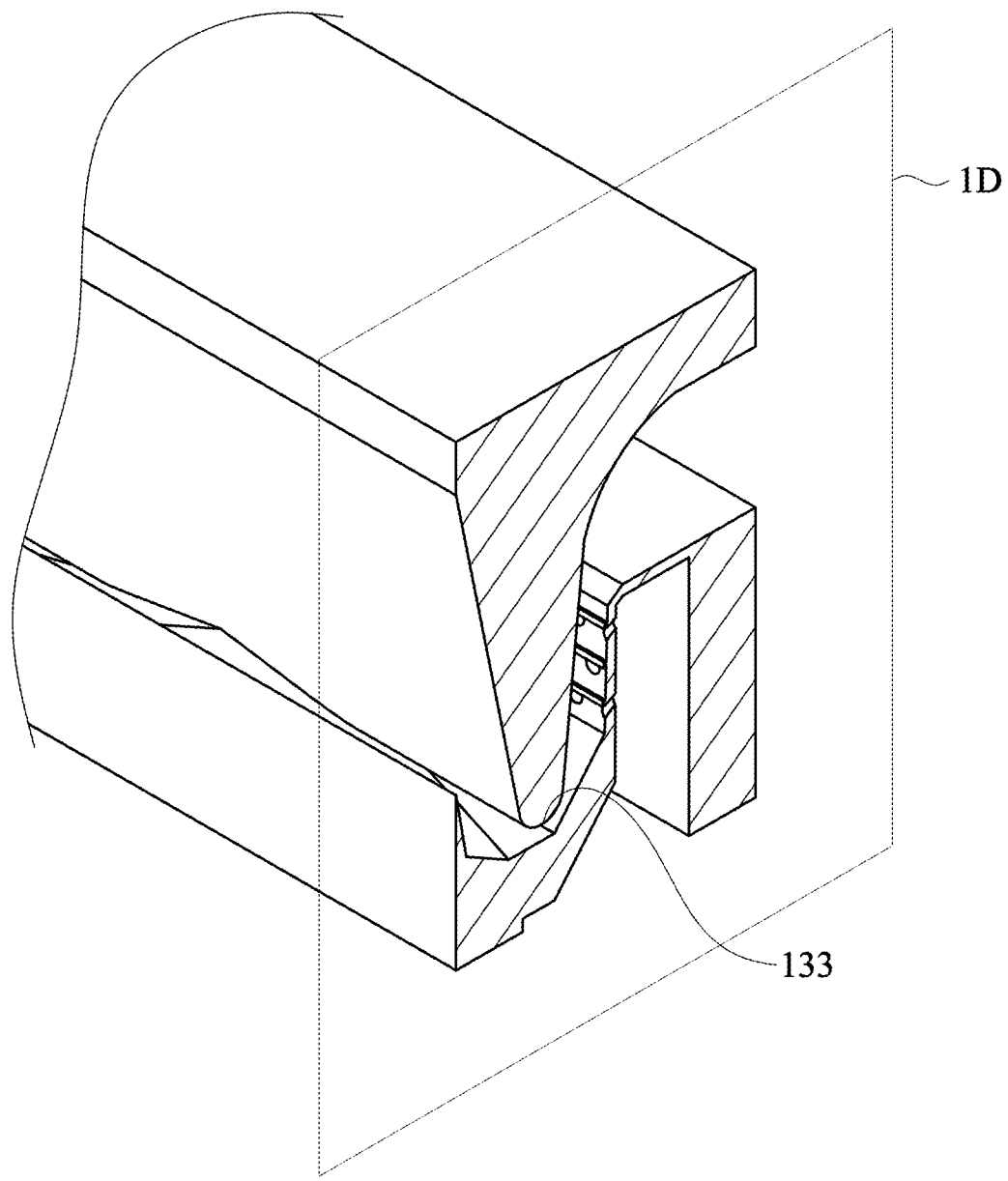
FIG. 1D, FIG. 1E and FIG. 1F show cross-sectional views of the dust collector of FIG. 1C along section lines 1D, 1E and 1F, respectively.
Figure 1E:
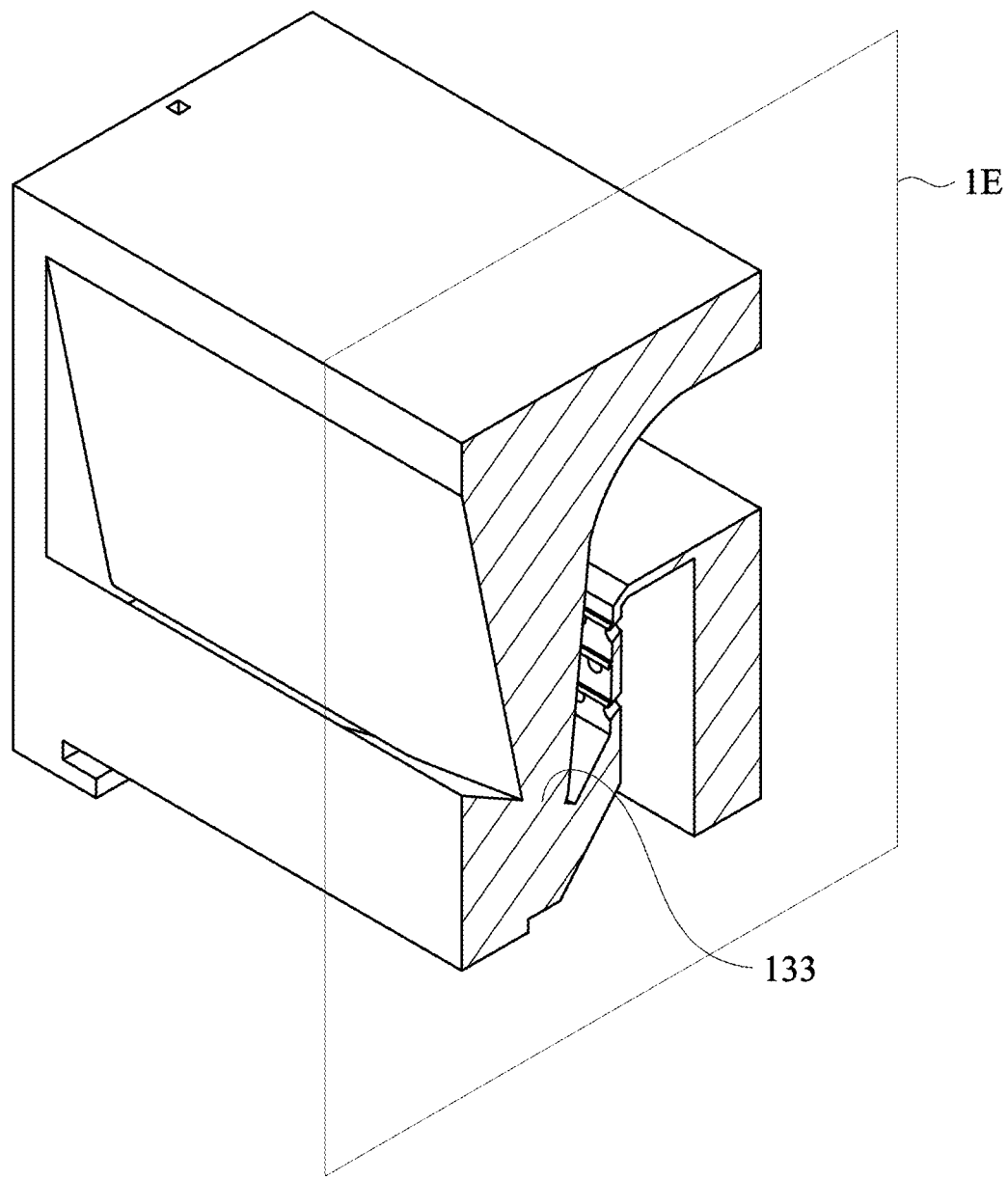
Figure 1F:
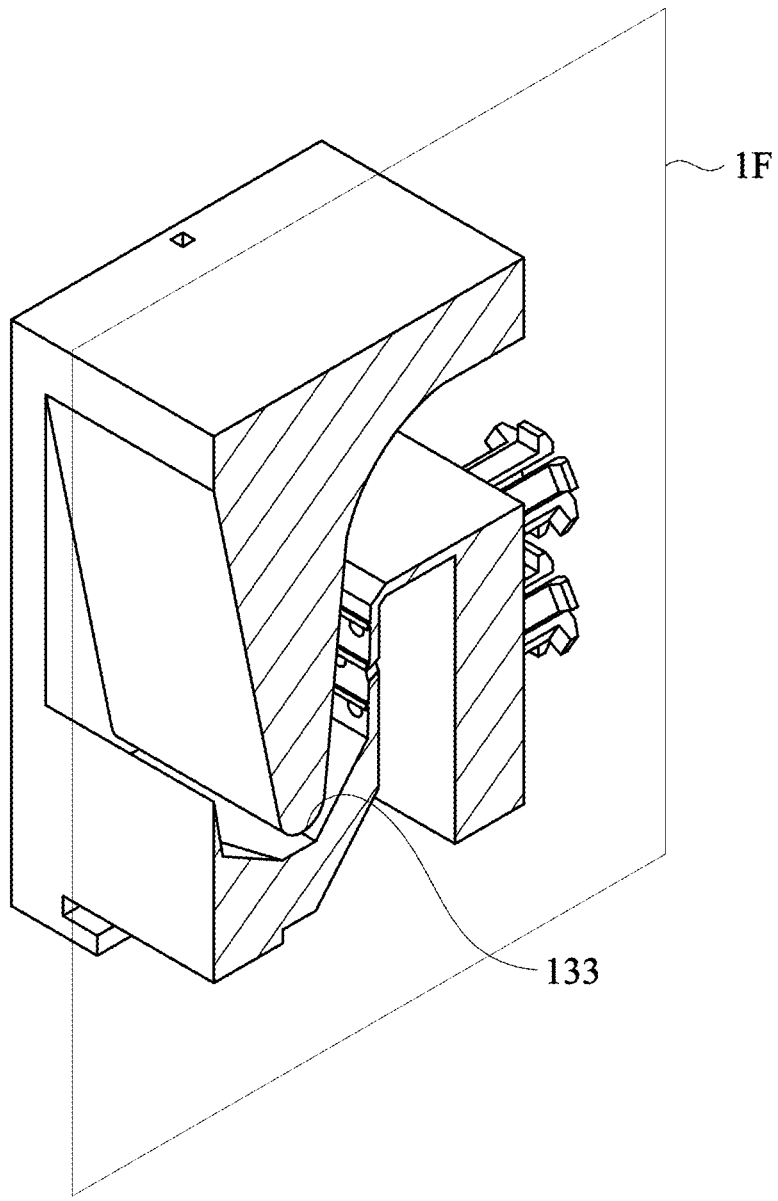

In the embodiment, the guide block 13 has a front guide surface 131 and a rear guide surface 132 disposed on a front side and a rear side of the guide block 13, respectively. In the specification, the front side refers to a side where the airflow enters, and the rear side refers to a side where the airflow exits. The front guide surface 131 and the rear guide surface 132 may be flat surfaces or curved surfaces. In the embodiment, the front guide surface 131 and the rear guide surface 132 slant and retract downwards such that top thickness t1 of the guide block 13 is greater than bottom thickness t2 of the guide block 13. A bottom side of the guide block 13 has a guide curved surface 133 configured to prevent reflux, and connected between a bottom of the front guide surface 131 and a bottom of the rear guide surface 132. In the embodiment, the guide curved surface 133 has a curvature greater than a top surface 120 of the base 12 disposed below the guide curved surface 133, thereby preventing reflux. In one example, the guide curved surface 133 has a curvature radius ranged between 3 and 10 mm, but may be changed according to specific application requirements. FIG. 1C shows a perspective view illustrating a dust collector 100 according to one embodiment of the present disclosure. FIG. 1D, FIG. 1E and FIG. 1F show cross-sectional views of the dust collector 100 of FIG. 1C along section lines 1D, 1E and 1F, respectively. In the embodiment, the guide curved surface 133 has a fixed curvature radius of 6.51859 mm (with a fixed curvature of 0.153408) along the section lines 1D, 1E and 1F.

As shown in FIG. 1A and FIG. 1B, a top edge 131A of the front guide surface 131 and a top edge 12A of the base 12 define an airflow inlet 13A of the passage structure configured to allow the airflow containing dust particles to enter. Moreover, the front guide surface 131 and the top surface 120 of the base 12 define an airflow entering path configured to allow the entered airflow to pass the airflow entering path. In one embodiment, the base 12 has a slanted top surface 120, which, for example, slants downwards from the airflow inlet 13A toward inside of the dust collector 100. In the embodiment, a cross section area of the airflow entering path decreases gradually from the airflow inlet 13A to the guide curved surface 133. As exemplified in FIG. 1B, a cross section area a1 of the airflow inlet 13A is greater than a cross section area a2 of the guide curved surface 133. According to nozzle effect, the airflow is accelerated while passing the guide curved surface 133, therefore the passage structure composed of the base 12 and the guide block 13 may accelerate the airflow containing dust particles. The front guide surface 131, the rear guide surface 132 and the top surface 120 of the base 12 may be coated with a smooth and/or anti-static material to prevent dust particles from sticking thereto.

Figure 1G:
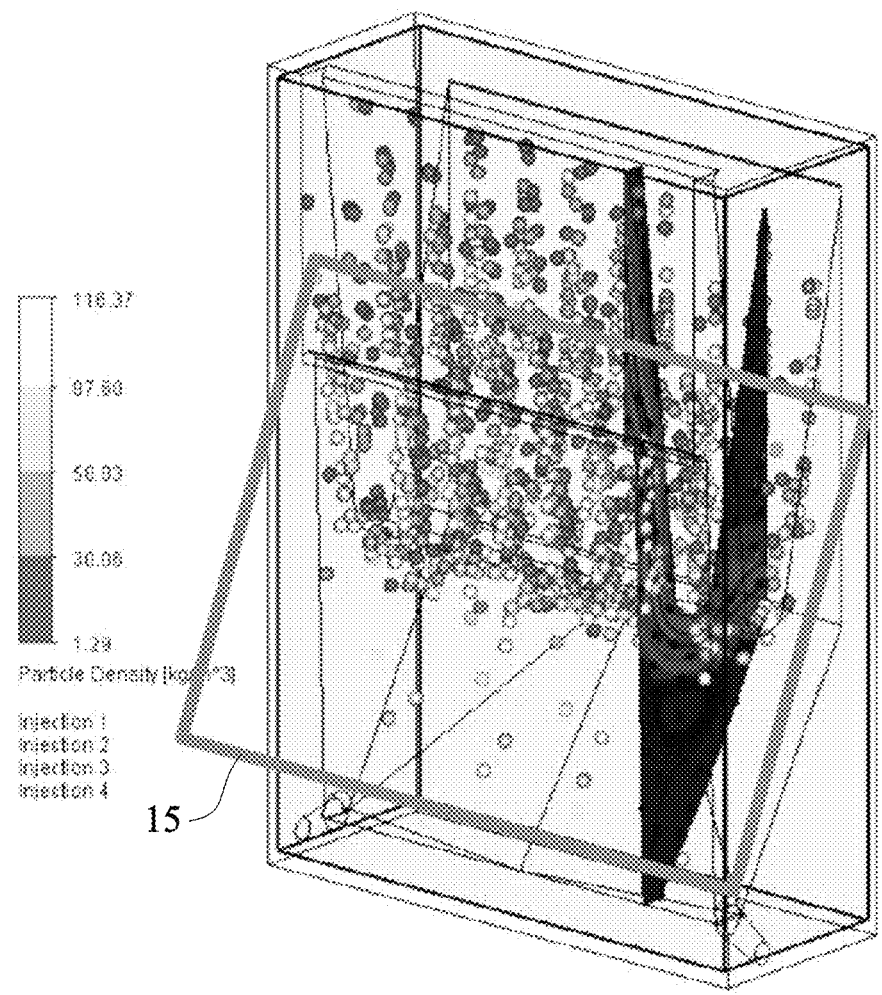
FIG. 1G shows a dust particles simulation diagram of the dust collector according to the embodiment of the present disclosure.

According to another aspect of the embodiment, the dust collector 100 may include a shield 14 erected on the base 12 and facing the rear guide surface 132. The shield 14 may be erected vertically or slantingly. The rear guide surface 132 and the shield 14 define an airflow exiting path configured to allow the exiting airflow to pass the airflow exiting path. Moreover, a top edge 132A of the rear guide surface 132 and a top edge 14A of the shield 14 define an airflow outlet 13B configured to allow the airflow to exit. According to centrifugal force generated by the large curvature of the guide curve surface 133 and inertial effect of the dust particles, dust particles with greater mass will be farther away from the guide block 13 (i.e., nearer the shield 14). Accordingly, the passage structure composed of the base 12 and the guide block 13 may separate the dust particles from the airflow. FIG. 1G shows a dust particles simulation diagram of the dust collector 100 according to the embodiment of the present disclosure, wherein dust particles entering an area 15 of the shield 14 may reach 70-75% dust collection rate.

In the embodiment, the shield 14 has a plurality of through holes 141 configured to allow the dust particles to pass the through holes 141. In one embodiment, as shown in a cross-sectional view illustrating the shield 14, an inlet diameter d1 (e.g., about 1-3 mm) of the through hole 141 facing the guide block 13 is smaller than an outlet diameter d2 (e.g., about 3-5 mm) of the through hole 141 back against the guide block 13. Accordingly, a hole wall 141A of the through hole 141 slants outwards configured to facilitate entering dust particles when facing the shield 14. Moreover, a baffle 142 may be extended from a top edge 141B of the through hole 141 facing the guide block 13 configured to facilitate entering of dust particles. In another embodiment, as shown in a cross-sectional view illustrating the shield 14, an inlet diameter d3 of the through hole 141 facing the guide block 13 is substantially the same as an outlet diameter d4 of the through hole 141 back against the guide block 13. Accordingly, a hole wall 141C of the through hole 141 slants upwards configured to facilitate entering dust particles when facing the shield 14.

The through holes 141 of the shield 14 may be arranged according to specific application requirements. FIG. 3A shows a schematic diagram illustrating one arrangement of the through holes 141 of the shield 14, wherein rows and columns of the through holes 141 are substantially aligned. FIG. 3B shows a schematic diagram illustrating another arrangement of the through holes 141 of the shield 14, wherein rows of the through holes 141 are substantially aligned but columns of the through holes 141 are staggered. FIG. 3C shows a schematic diagram illustrating a further arrangement of the through holes 141 of the shield 14, wherein the through holes 141 of the same row (or column) are connected. Density (or spacing) of the through holes 141 of the shield 14 need not be uniform, and diameters of the through holes 141 need not be the same. The density (or spacing) or the diameter may be determined according to the size of the dust particles.

In the embodiment, a dust collecting region 143 may be disposed behind the shield 14 (i.e., away from the guide block 13) and above the base 12. The dust collecting region 143 may be a space defined by a portion of the housing 11 and the shield 14 to accommodate dust particles entered from the through holes 141. At least one groove 121 is disposed in the base 12 below the dust collecting region 143 to eject the dust particles in the dust collecting region 143 by gravity. Generally speaking, depth of the groove 121 is substantially greater than aperture of the groove 121. In one embodiment, a ratio of the depth to the aperture of the groove 121 is greater than 10. In one embodiment, aperture of the groove 121 retracts downwards to prevent reflux of the dust particles. In one embodiment, the top surface 120 of the base 12 on two sides of the groove 121 is a curved surface configured to facilitate sliding dust particles into the groove 121. The top surface 120 of the base 12 below the dust collecting region 143 may be coated with a smooth and/or anti-static material to prevent dust particles from sticking thereto.

In one embodiment, at least one side hole 122 may be disposed on a side 11C of the housing 11 near the base 12 to allow the dust particles that hit the guide block 13 to be ejected through the side hole 122. Moreover, the top surface 120 of the base 12 near the side hole 122 may have a level lower than other areas to facilitate sliding dust particles into the side hole 122.

Figure 4A:
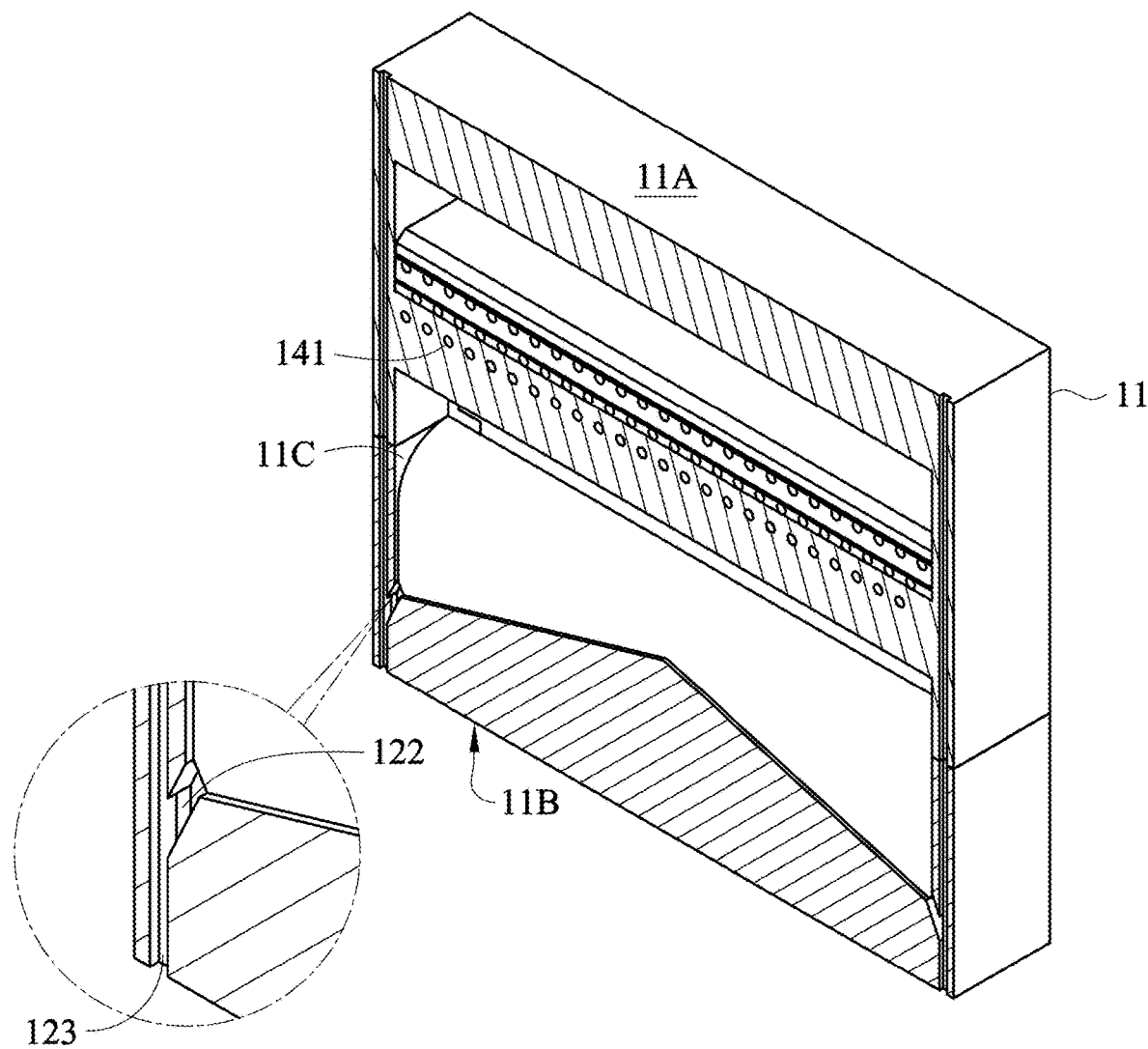
FIG. 4A shows a perspective view illustrating a dust collector according to a second embodiment of the present disclosure.
Figure 4B:
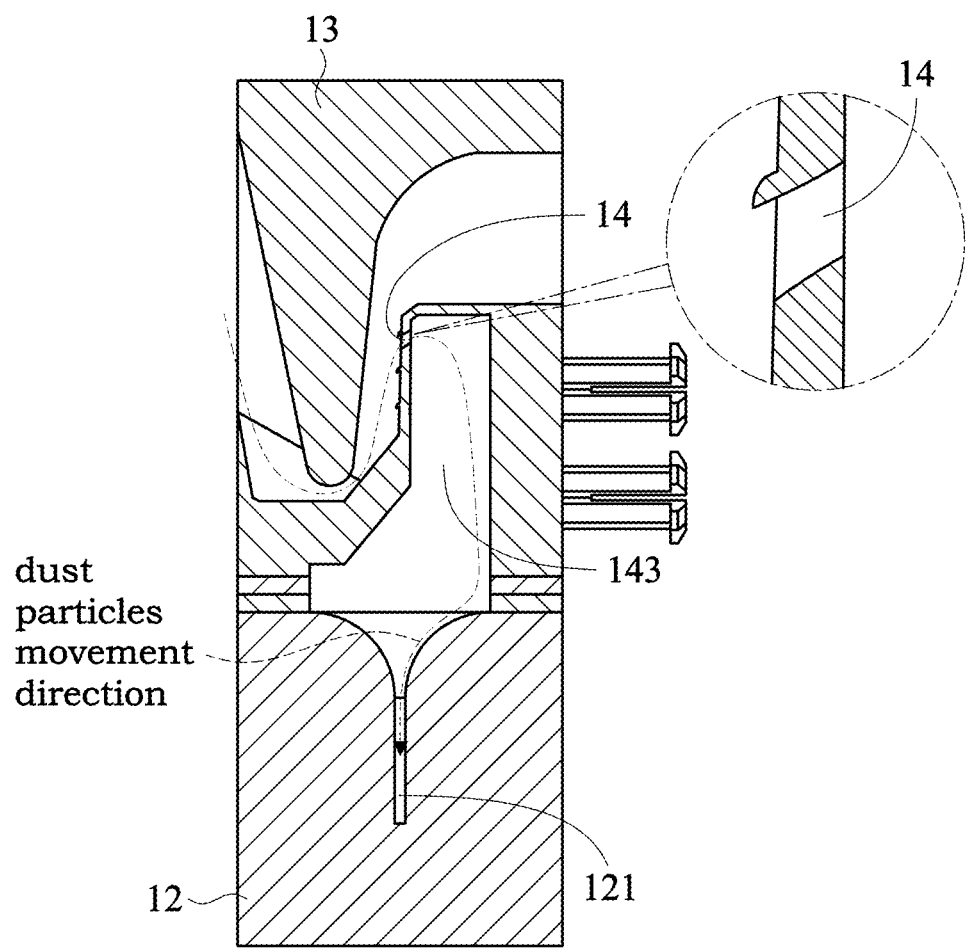
FIG. 4B shows a cross-sectional view illustrating the dust collector of FIG. 4A.
Figure 5A:
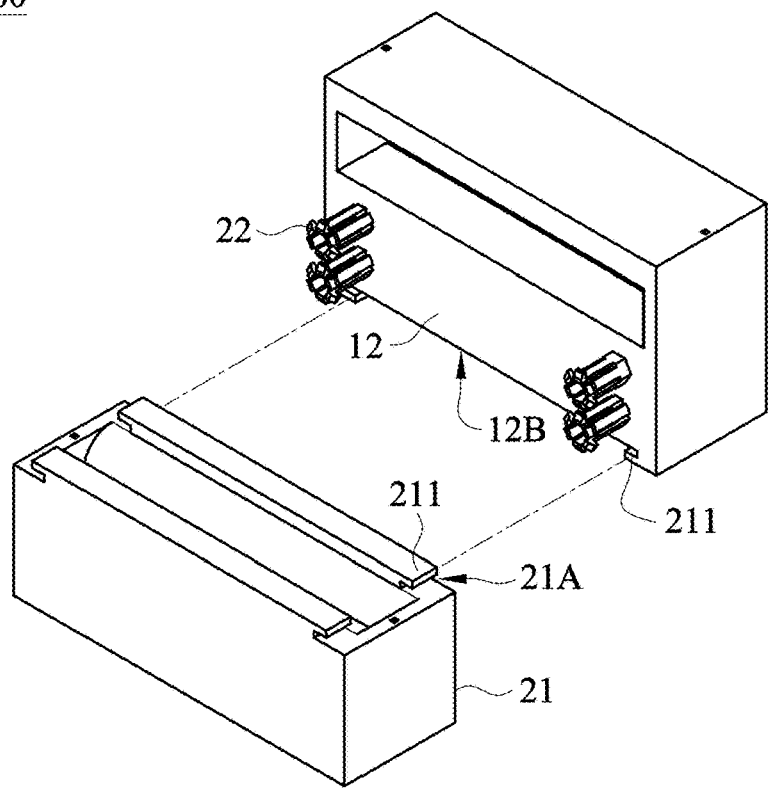
FIG. 5A shows an exploded perspective view illustrating the dust collector according to the second embodiment of the present disclosure.
Figure 5B:
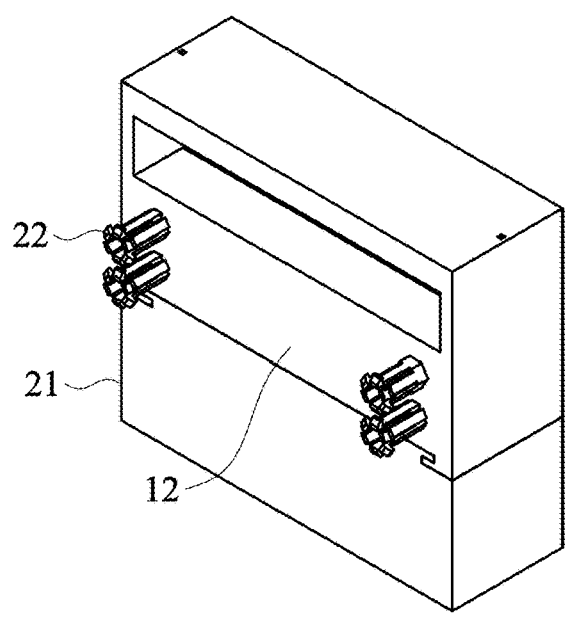
FIG. 5B shows a perspective view illustrating an assembled dust collector according to the second embodiment of the present disclosure.

FIG. 4A shows a perspective view illustrating a dust collector 200 according to a second embodiment of the present disclosure, and FIG. 4B shows a cross-sectional view illustrating the dust collector 200 of FIG. 4A. FIG. 5A shows an exploded perspective view illustrating the dust collector 200 according to the second embodiment of the present disclosure, and FIG. 5B shows a perspective view illustrating an assembled dust collector 200 according to the second embodiment of the present disclosure.

The second embodiment has a structure similar to the first embodiment (FIG. 1A/FIG. 1B), which may include a base 12, a guide block 13, a shield 14, a dust collecting region 143 and a groove 121, details of which are omitted for brevity. According to one aspect of the second embodiment, as shown in FIG. 5A and FIG. 5B, the dust collector 200 may further include a dust collecting drawer 21 disposed below the base 12 configured to collect the dust particles sliding into the groove 121. Moreover, a top 21A of the dust collecting drawer 21 and a bottom 12B of the base 12 may have corresponding joints 211 such that the dust collecting drawer 21 may be detachable from the base 12, thereby facilitating pouring out dust particles from the dust collecting drawer 21.

Figure 6A:
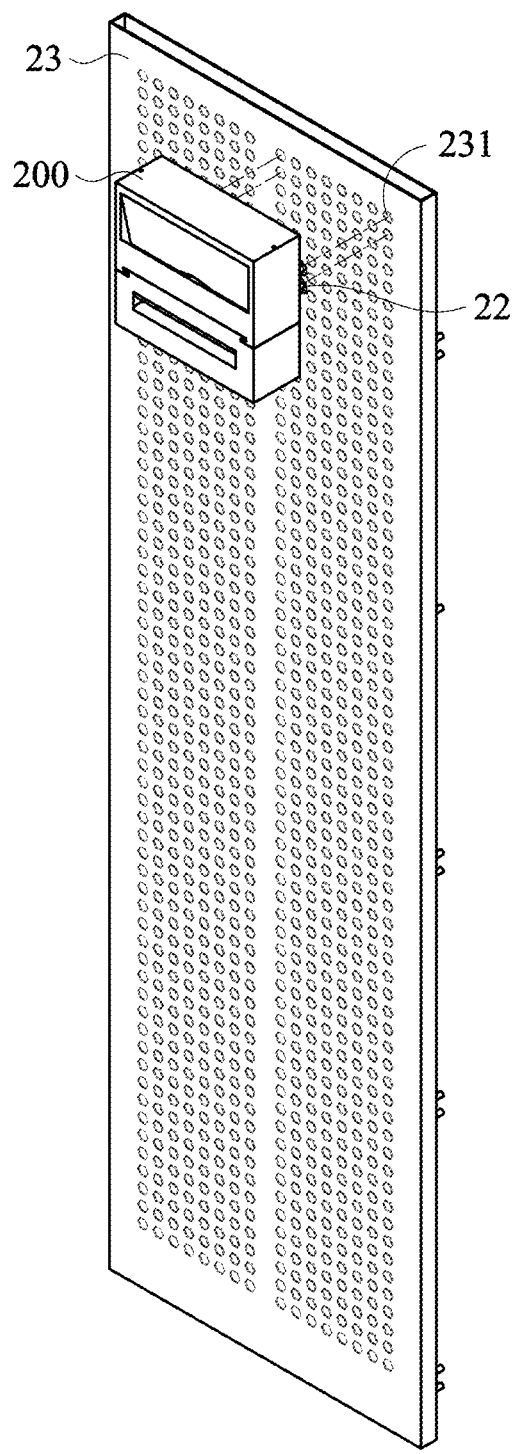
FIG. 6A to FIG. 6E show perspective views illustrating connecting the dust collector to an electronic device via a bridging board, thereby resulting in an electronic system capable of automatically removing dust particles.
Figure 6B:
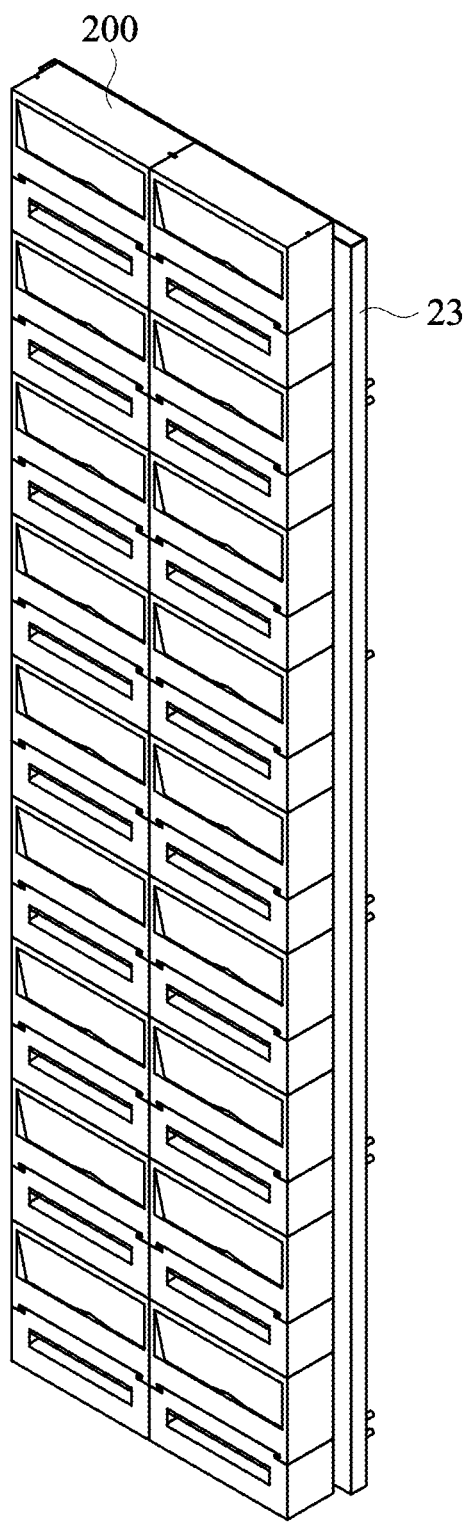
Figure 6C:
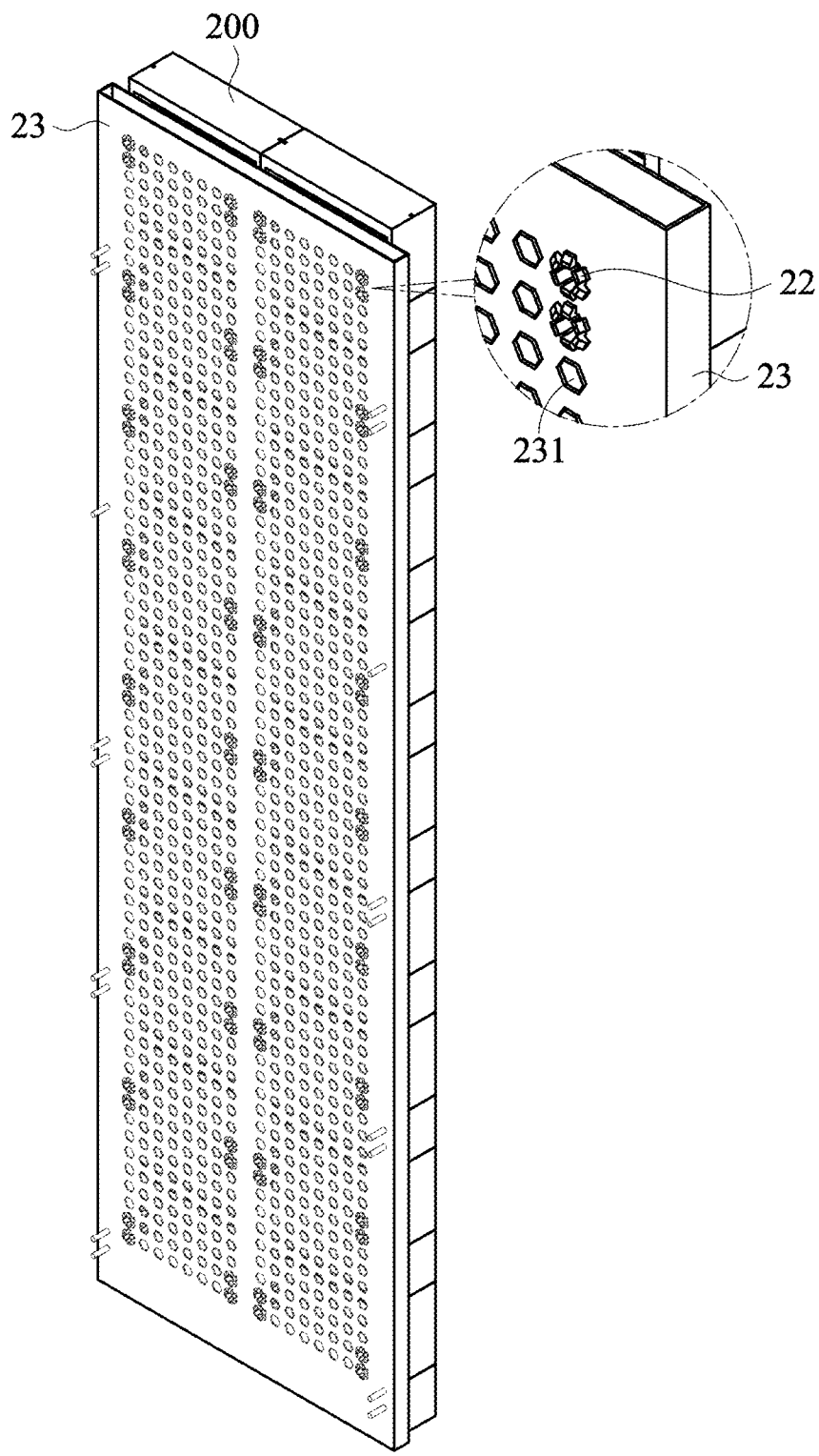
Figure 6D:
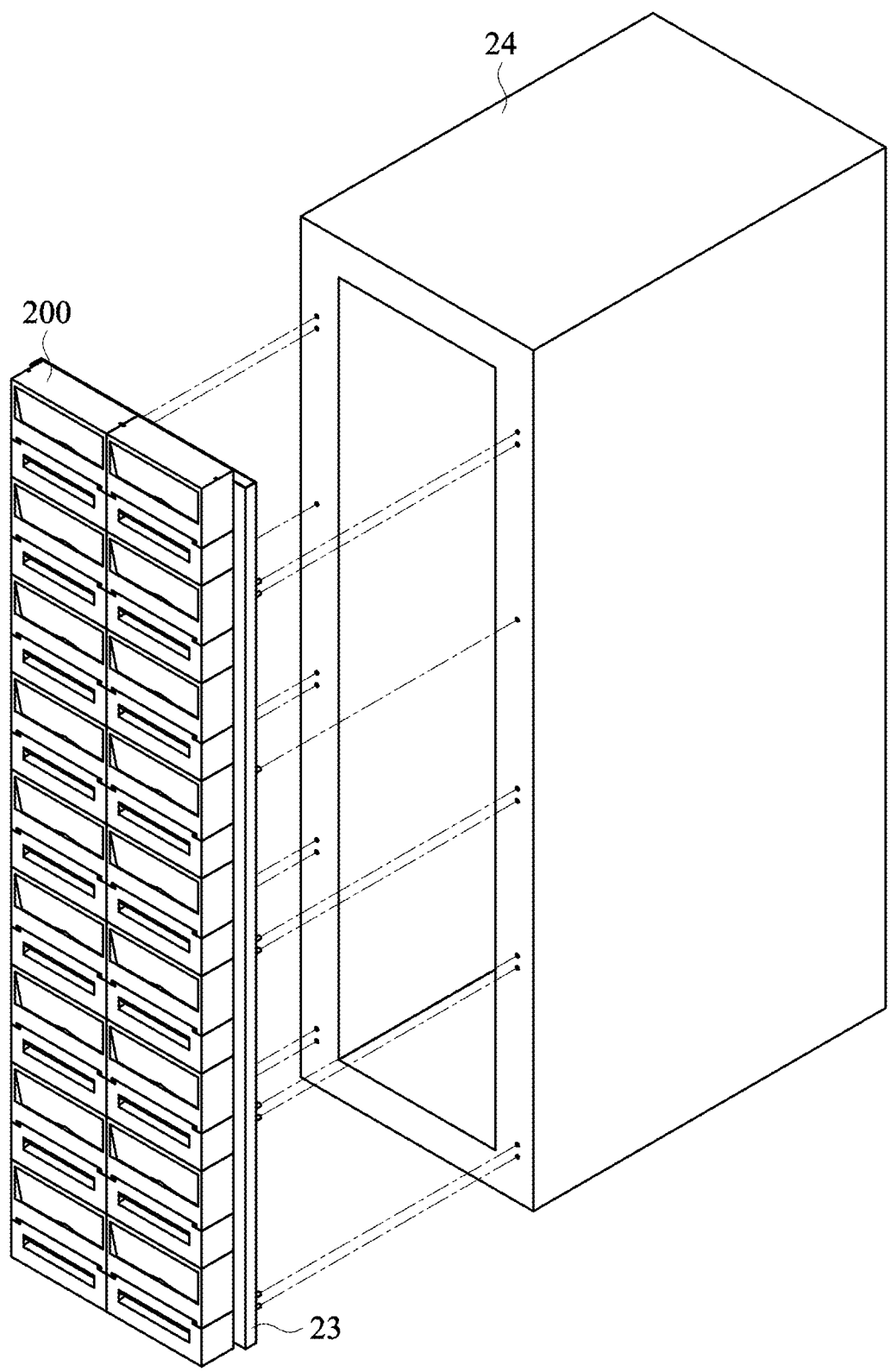
Figure 6E:
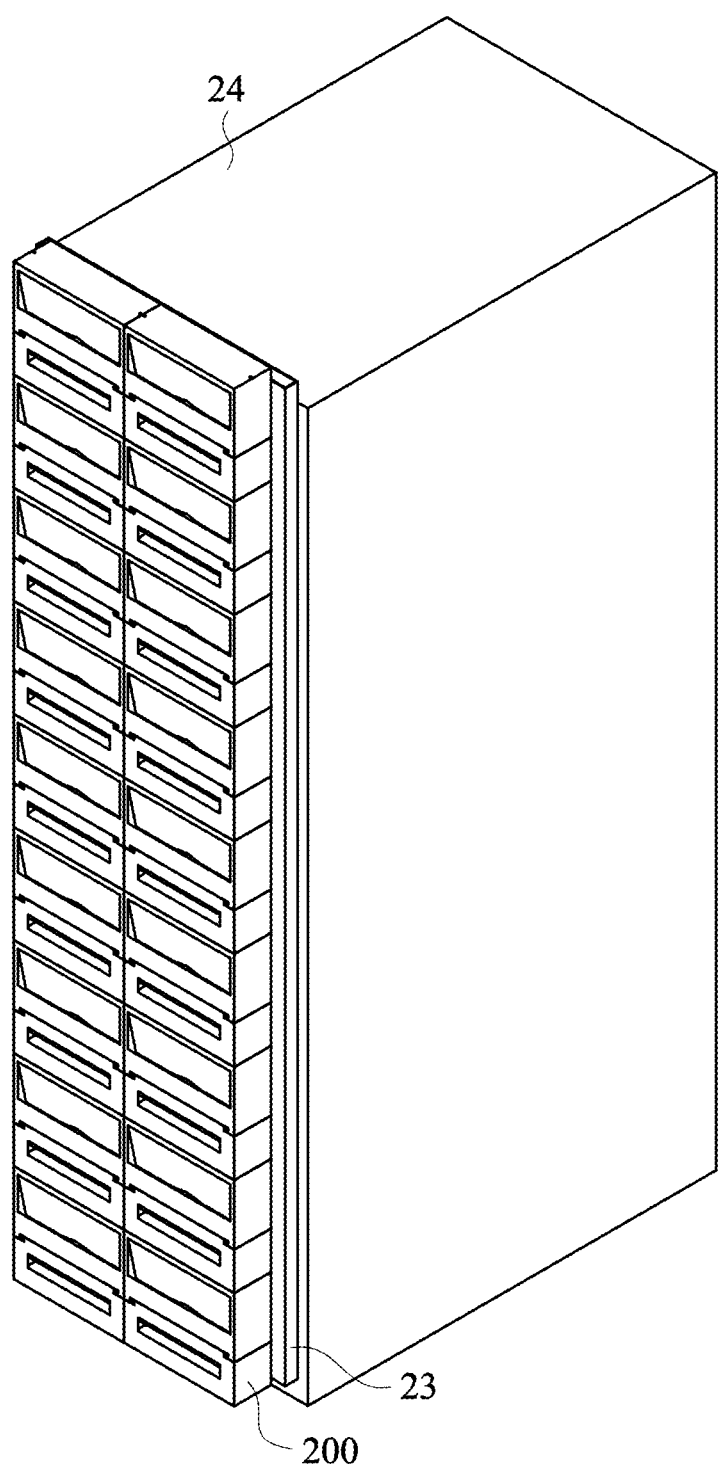

According to a second aspect of the second embodiment, hooks 22 may be disposed on an outer side of the housing 11 of the dust collector 200, as shown in FIG. 5A, configured to connect the dust collector 200 to an electronic device. In one embodiment, the dust collector 200 is indirectly connected to the electronic device via a bridging board 23. FIG. 6A to FIG. 6E show perspective views illustrating connecting the dust collector 200 to an electronic device 24 via the bridging board 23, thereby resulting in an electronic system capable of automatically removing dust particles. As shown in FIG. 6A, the bridging board 23 has a plurality of openings 231 disposed on a surface of the bridging board 23 configured to receive the corresponding hooks 22, thereby connecting the dust collector 200 to the bridging board 23. As shown in FIG. 6B, a plurality of dust collectors 200 may be connected to the bridging board 23 according to specific dust collecting requirements. FIG. 6C shows a perspective view opposite that of FIG. 6B, and shows an enlarged view of the hooks 22 and the openings 231. As show in FIG. 6D, the bridging board 23 is connected with the side without the dust collector 200 to one side (e.g., rear side or front side) of the electronic device 24 (e.g., a server). FIG. 6E shows a perspective view illustrating an assembled electronic system.

According to a third aspect of the second embodiment, as shown in FIG. 4A, not only the side hole 122 is disposed on the side 11C of the housing 11, a connecting passage 123 may be connected to the side hole 122. Two ends of the connecting passage 123 may be disposed on a top surface 11A and a bottom surface 11B of the housing 11, respectively. When the dust collectors 200 are stacked vertically, as exemplified in FIG. 6B, individual connecting passages 123 may be connected together to allow dust particles to drop from the upper dust collector 200 to the lower dust collector 200.

For the foregoing, the dust collector 100/200 of the embodiment can effectively collect dust particles from the airflow. More importantly, the airflow entering/exiting path of the dust collector 100/200 may operate in coordination with a heat dissipation path of the electronic device 24 to allow a heat collecting airflow of the electronic device 24 to pass the dust collector 100/200 of the embodiment, therefore reaching the purpose of removing dust particles without obstructing heat dissipation of the electronic device 24. As shown in the dust particles simulation diagram of FIG. 1G, dust particles entering the area 15 of the shield 14 may reach 70-75% dust collection rate. The airflow containing other 25-30% of dust particles can perform heat dissipation. Accordingly, combination of the dust collector 100/200 and the electronic device 24 can reach optimal dust collecting and heat dissipation.

Although specific embodiments have been illustrated and described, it will be appreciated by those skilled in the art that various modifications may be made without departing from the scope of the present disclosure, which is intended to be limited solely by the appended claims.

What is claimed is:

1. A dust collector, comprising:
   a housing;
   a passage structure disposed in the housing, the passage structure accelerating an airflow containing dust particles and separating the dust particles from the airflow;
   an entire dust collecting region connected to the passage structure, the dust collecting region collecting at least part of the dust particles of the airflow; and
   a shield disposed between the passage structure and the dust collecting region, the shield having a plurality of through holes configured to allow the dust particles to pass the through holes and then to enter the dust collecting region;
   wherein the entire dust collecting region is disposed behind the shield, and is defined by a top portion of the housing, a rear portion of the housing and the shield;
   wherein the passage structure comprises a single guide block disposed at a top of the housing, the guide block including a front guide surface and a rear guide surface disposed on a front side and a rear side of the guide block respectively, the front guide surface and the rear guide surface slanting and retracting downwards;
   wherein at least one of the plurality of through holes of the shield corresponding to the guide block is disposed higher than a bottom of the corresponding guide block, the shield and the corresponding guide block being associated with a same airflow exiting path defined by the shield and the rear guide surface of the corresponding guide block.

2. The dust collector of claim 1, wherein the passage structure comprises:
   a base disposed at a bottom of the housing.

3. The dust collector of claim 2, wherein the guide block further comprises a guide curved surface connected between a bottom of the front guide surface and a bottom of the rear guide surface, and configured to prevent reflux;
   wherein a top edge of the front guide surface and a top edge of the base define an airflow inlet configured to allow the airflow containing dust particles to enter, the front guide surface and a top surface of the base define an airflow entering path, and a cross section area of the airflow entering path decreases gradually from the airflow inlet to the guide curved surface.

4. The dust collector of claim 3, wherein the guide curved surface has a curvature greater than the top surface of the base disposed below the guide curved surface, thereby preventing reflux.

5. The dust collector of claim 3, wherein at least one side hole is disposed on a side of the housing near the base, and disposed between the shield and the airflow inlet.

6. The dust collector of claim 5, wherein a connecting passage is connected to the side hole, and two ends of the connecting passage are disposed on a top surface and a bottom surface of the housing respectively.

7. The dust collector of claim 2, wherein top thickness of the guide block is greater than bottom thickness of the guide block.

8. The dust collector of claim 2, wherein the front guide surface, the rear guide surface or a top surface of the base is coated with a smooth or anti-static material.

9. The dust collector of claim 2, wherein at least one groove is disposed in the base below the dust collecting region.

10. The dust collector of claim 2, further comprising:
a dust collecting drawer disposed below the base; and
two joints disposed at a top of the dust collecting drawer and a bottom of the base respectively.

11. The dust collector of claim 1, wherein a top edge of the rear guide surface and a top edge of the shield define an airflow outlet.

12. The dust collector of claim 1, wherein an inlet diameter of the through holes facing the guide block is smaller than an outlet diameter of the through holes back against the guide block.

13. The dust collector of claim 1, wherein the through holes slant upwards when facing the shield.

14. The dust collector of claim 1, further comprising a baffle extended from a top edge of the through holes.

15. The dust collector of claim 1, wherein rows and columns of the through holes are substantially aligned.

16. The dust collector of claim 1, wherein rows of the through holes are substantially aligned but columns of the through holes are staggered.

17. The dust collector of claim 1, wherein the through holes of a same row or column are connected.

18. An electronic system capable of automatically removing dust, comprising:
an electronic device that generates a heat collecting airflow in a heat dissipation path of the electronic device; and
at least one dust collector connected to one side of the electronic device, each dust collector comprising:
a housing;
a passage structure disposed in the housing, the passage structure accelerating the heat collecting airflow containing dust particles and separating the dust particles from the heat collecting airflow;
an entire dust collecting region connected to the passage structure, the dust collecting region collecting at least part of the dust particles of the heat collecting airflow; and
a shield disposed between the passage structure and the dust collecting region, the shield having a plurality of through holes configured to allow the dust particles to pass the through holes and then to enter the dust collecting region;
wherein the entire dust collecting region is disposed behind the shield, and is defined by a top portion of the housing, a rear portion of the housing and the shield;
wherein an airflow path of the dust collector operates in coordination with the heat dissipation path of the electronic device to allow the heat collecting airflow of the electronic device to pass the dust collector without obstructing heat dissipation of the electronic device;
wherein the passage structure comprises a guide block disposed at a top of the housing, and at least one of the plurality of through holes of the shield corresponding to the guide block is disposed higher than a bottom of the corresponding guide block, the shield and the corresponding guide block being associated with a same airflow exiting path defined by the shield and a rear guide surface of the corresponding guide block.

* * * * *